US005752179A

United States Patent [19]

Dobrovolny

[11] Patent Number: 5,752,179

[45] Date of Patent: May 12, 1998

[54] SELECTIVE RF CIRCUIT WITH VARACTOR TUNED AND SWITCHED BANDPASS FILTERS

[75] Inventor: Pierre Dobrovolny, North Riverside, Ill.

[73] Assignee: Zenith Electronics Corporation, Glenview, Ill.

[21] Appl. No.: 516,031

[22] Filed: Aug. 17, 1995

[51] Int. Cl.[6] .............................. H04B 1/18; H03H 7/00; H03H 5/12

[52] U.S. Cl. .................. 455/266; 455/180.4; 455/191.2; 455/188.2; 333/174; 334/15

[58] Field of Search ............................ 455/168.1, 169.1, 455/169.2, 178.1, 179.1, 180.1, 180.2, 180.3, 180.4, 188.1, 188.2, 189.1, 190.1, 191.2, 280, 282, 284, 290, 266, 339–340, 193.1–193.3; 334/15, 47, 55; 333/174, 177, 175, 176, 129, 132

[56] References Cited

U.S. PATENT DOCUMENTS

| | | | |
|---|---|---|---|
| 3,573,683 | 4/1971 | Marshall et al. | 334/15 |
| 3,903,487 | 9/1975 | Maier | 334/15 |
| 4,339,827 | 7/1982 | Torres et al. | 455/188.1 |
| 4,480,338 | 10/1984 | Dobrovolny | 455/188 |
| 4,571,560 | 2/1986 | Dobrovolny | 333/174 |
| 4,736,457 | 4/1988 | Kupfer | 455/188.2 |
| 4,839,617 | 6/1989 | Speake | 333/174 |
| 4,907,292 | 3/1990 | Leipert | 456/188.2 |
| 5,150,085 | 9/1992 | Hales | 333/174 |
| 5,179,726 | 1/1993 | Moon | 455/180.4 |
| 5,285,179 | 2/1994 | Wignot et al. | 455/191.2 |
| 5,311,318 | 5/1994 | Dobrovolny | 348/731 |
| 5,376,907 | 12/1994 | Duflot et al. | 333/174 |
| 5,483,209 | 1/1996 | Takayama | 455/188.1 |
| 5,499,056 | 3/1996 | Pugel | 455/188.1 |
| 5,550,520 | 8/1996 | Kobayashi | 333/213 |

*Primary Examiner*—Reinhard J. Eisenzopf
*Assistant Examiner*—Sam Bhattacharya

[57] ABSTRACT

A selective RF circuit for a double conversion tuner includes three sections: low and mid band double tuned bandpass sections and a high band double tuned bandpass section. Each section includes tuning varactors and one or more coupling varactors. The varactors are operated in a first tuning mode for exhibiting a variable capacitance and in a second mode for presenting a substantial low impedance across their terminals. A microprocessor controlled circuit arrangement applies DC potentials to the tuning and coupling varactors and to two pairs of switching diodes simultaneously for selecting and tuning the desired bandpass section. The varactors in each bandpass section are complemented with fixed capacitors selected so that the product of the loaded Q and the coupling factor of any active double tuned bandpass filter is maintained substantially equal to unity over the entire tuning range.

16 Claims, 3 Drawing Sheets

RF IN
10
SELECTIVE BP FILTERING
RF OUT
11
AMP.
14
1st MIXER
18
1st IF FILTER, AGC & AMP.
20
2nd. MIXER
28
2nd IF AMP.
29
SIGNAL PROCESS.
AFC
26
2nd L.O.
24
+
11
1st L.O.
13
FILTER
22
D/A
21
PRE SCALER
19
PROG. DIVIDER
16
15
Ø DET.
17
XTAL REF.
12
μp

SELECTIVE RF CIRCUIT WITH VARACTOR TUNED AND SWITCHED BANDPASS FILTERS

BACKGROUND OF THE INVENTION AND PRIOR ART

This invention relates generally to RF input circuits and particularly to an RF input circuit for use in a double conversion tuner for digital television signals such as that in the proposed Zenith/AT&T Digital Spectrum Compatible High Definition Television System (DSC/HDTV). U.S. Pat. No. 4,435,841 issued to the inventor and assigned to Zenith Electronics Corporation is concerned with reducing second and third order intermodulation distortion in a double conversion tuning system. Essentially a series of capacitors and inductors are selectively switched to exhibit high pass and low pass characteristics over the tuning band for controlling intermodulation distortion by restricting the bandwidth of incoming signals as the various channels are tuned. U.S. Pat. No. 4,571,560 issued to the inventor and assigned to Zenith Electronics Corporation discloses a switched bandpass filter arrangement for a double conversion tuner. Each bandpass filter section includes a switching diode rendering the filter section active for passing, or inactive for suppressing, the band of frequencies to which it is tuned. Portions of the inactive bandpass filter sections contribute to developing frequency responses with notches at frequencies outside of the pass band of the active filter section. Thus some elements of the inactive bandpass filter sections are used with the active filter sections for improving the band rejection slopes. U.S. Pat. No. 5,311,318 issued to the inventor and assigned to Zenith Electronics Corporation discloses a double conversion tuner in which the first local oscillator is controlled by a low noise phase locked loop supplied with a first digital number and the second local oscillator is controlled by a second digital number that compensates the frequency of the second local oscillator for any deviation of the first IF frequency from a predetermined value. These patents provide the background for the present invention.

With the advent of digital transmission systems for television signals and HDTV there is a need to improve the television tuner performance beyond that which is currently acceptable with NTSC transmissions. In particular, the tuner selectivity must be addressed. It is desirable to widen and improve the frequency response within a 6 MHz TV channel and to reduce substantially variations in frequency response from channel to channel. It is also expected that HDTV transmission will be capable of utilizing the so-called taboo channels. With standard single conversion varactor tuned TV tuners, the above requirements are in opposition. A double conversion tuner (used for years by the cable TV industry) can yield some desired improvements but has other problems related to its wide band RF input. Unlike a single conversion tuner that has a low IF frequency which allows RF and local oscillator tracking, a state of the art double conversion tuner has a relatively high first IF frequency (about 1 GHz). Recent developments in dedicated microprocessors, D/A converters and electronic switching circuits make it possible to provide a double conversion tuner with a microprocessor controlled front end for RF selectivity, which is the subject of this invention.

OBJECTS OF THE INVENTION

A principal object of the invention is to provide a novel selective RF circuit optimized for performance and component count.

Another object of the invention is to provide a selective RF circuit for a double conversion double tuned bandpass tuning system usable in a digital transmission system.

A further object of the invention is to provide a digitally controllable selective RF tuning system.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
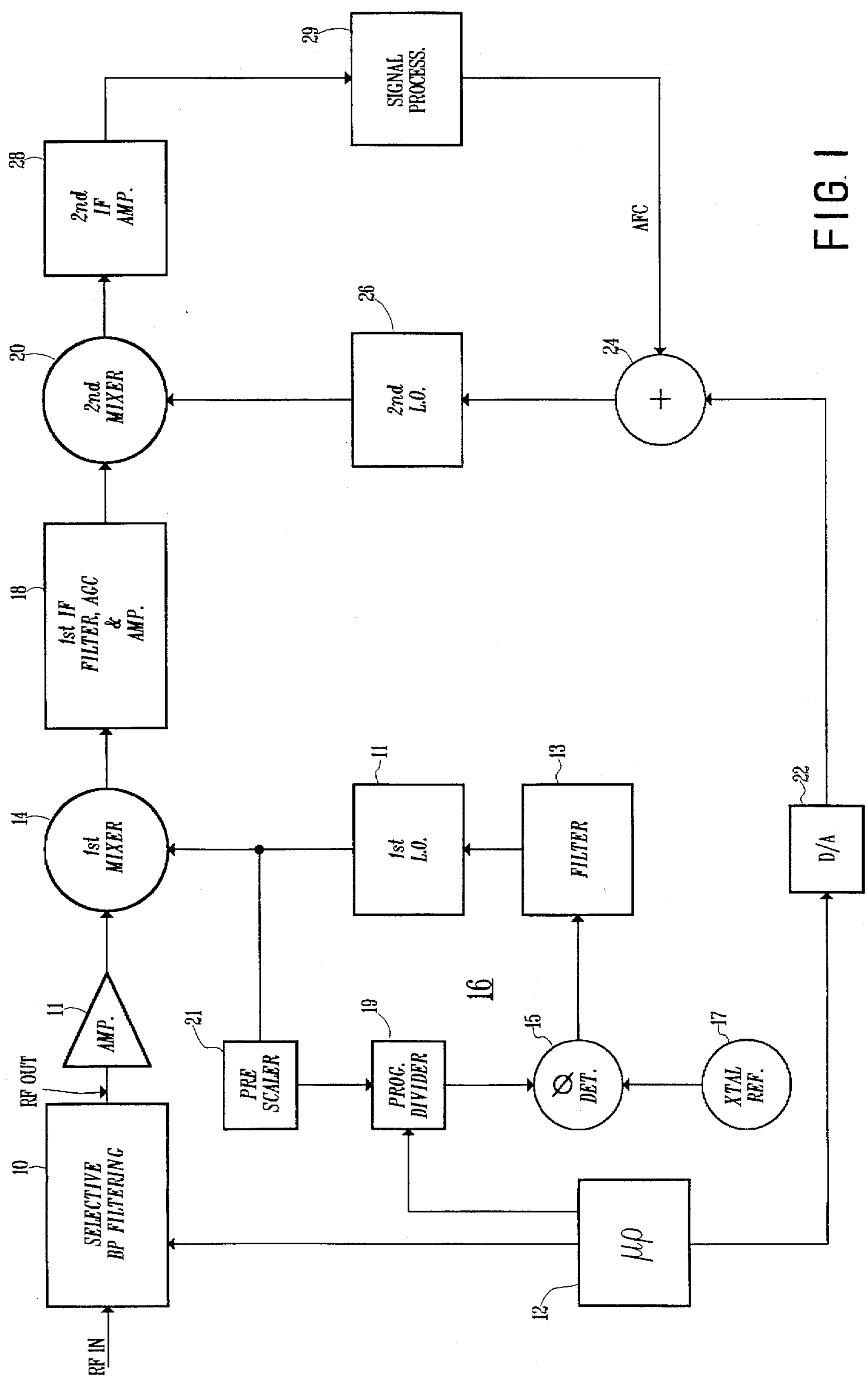
FIG. 1 is a partial block diagram of a double conversion tuner constructed in accordance with the invention.

In FIG. 1, an RF input which may either be a source of cable connected or over-the-air HDTV signals of 50 MHz–800 MHz, is supplied to a block 10 labelled selective bandpass filtering. The RF output of block 10 is supplied to an amplifier 11, and thence to a first mixer 14 that is supplied with a local oscillator signal from a phase locked loop synthesizer 16. The output of first mixer 14 is, for example, a 920 MHz IF signal that is applied to a first IF filter, AGC and amplifier 18. Signals from first IF amplifier 18 are applied to a second mixer 20, to which is also supplied the signal from a second local oscillator 26, which together produce a second IF signal frequency of 44 MHz. This second IF signal is applied to a second IF amplifier 28, the output of which is applied to a signal processing circuit 29, which includes further circuitry (not shown) for processing television signals. A microprocessor 12 controls block 10 and the synthesizer 16 (and eventually the second local oscillator 26). In accordance with the above-mentioned U.S. Pat. No. 5,311,318, synthesizer 16 includes a low phase noise phase locked loop for controlling a first local oscillator 11. To that end, a crystal reference 17, a phase detector 15 and a filter 13 are provided. Microprocessor 12 supplies a first digital number to a programmable divider 19. A prescaler 21 couples the output of oscillator 11 to the programmable divider which supplies an input to the phase detector 15. Because of the coarse tuning increments of the first local oscillator signal, the first IF signal frequency may vary a fraction of a MHz from the desired value. Microprocessor 12 also supplies a second digital number to a digital-to-analog (D/A) converter 22 that supplies an appropriate signal to an analog adder 24 (which is also supplied with an AFC signal from signal processor 29). The output of adder 24 is used to control the frequency of the second local oscillator 26 to compensate for any deviation in the first IF signal frequency and thus maintain a constant second IF signal frequency. It will be appreciated that although a double conversion tuner is shown, for purposes of this invention, any type of tuner can be used.

Figure 2:
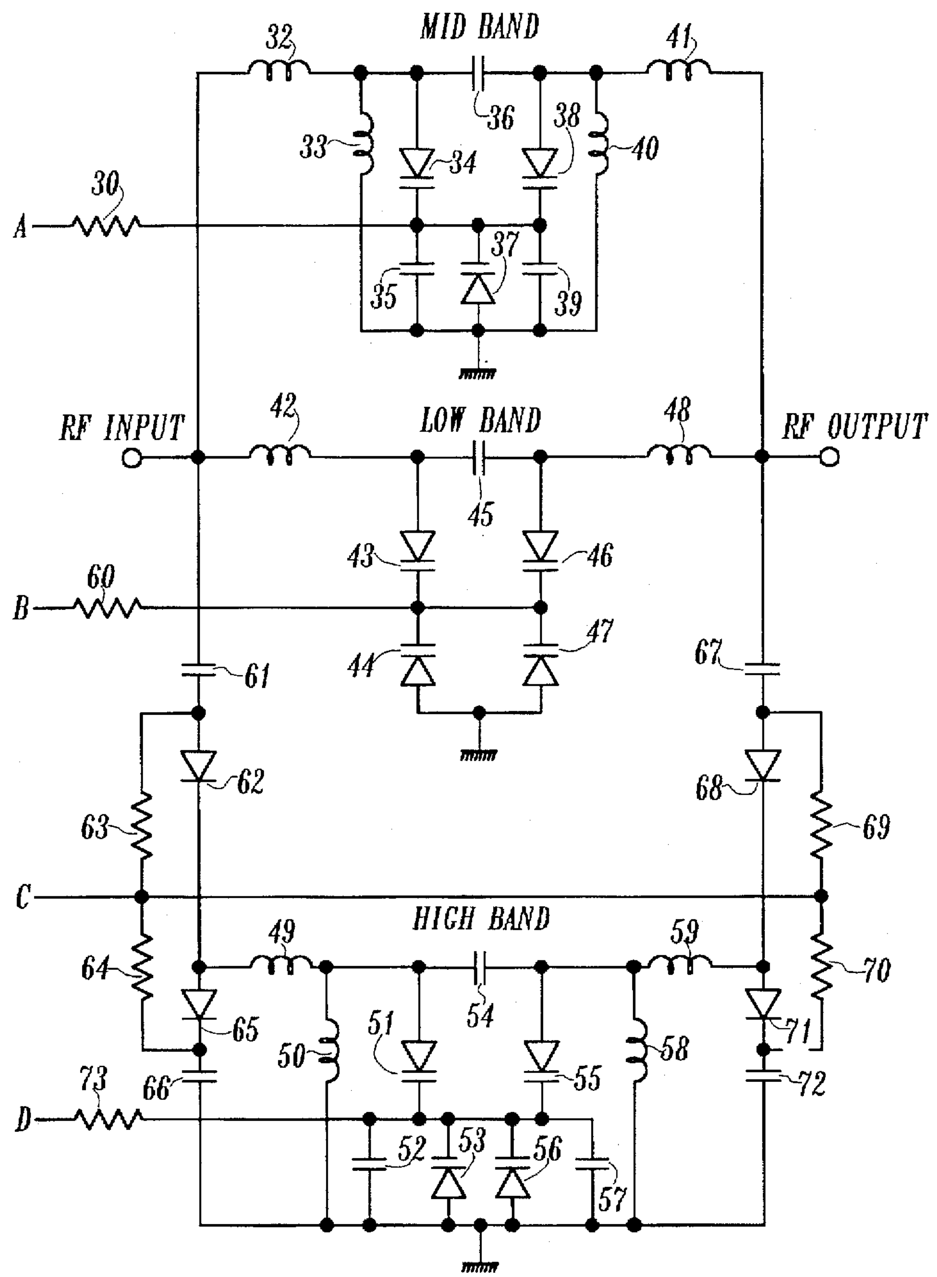
FIG. 2 is a schematic diagram of the selectively switched and varactor tuned bandpass circuits in the tuner of FIG. 1.
Figure 3:
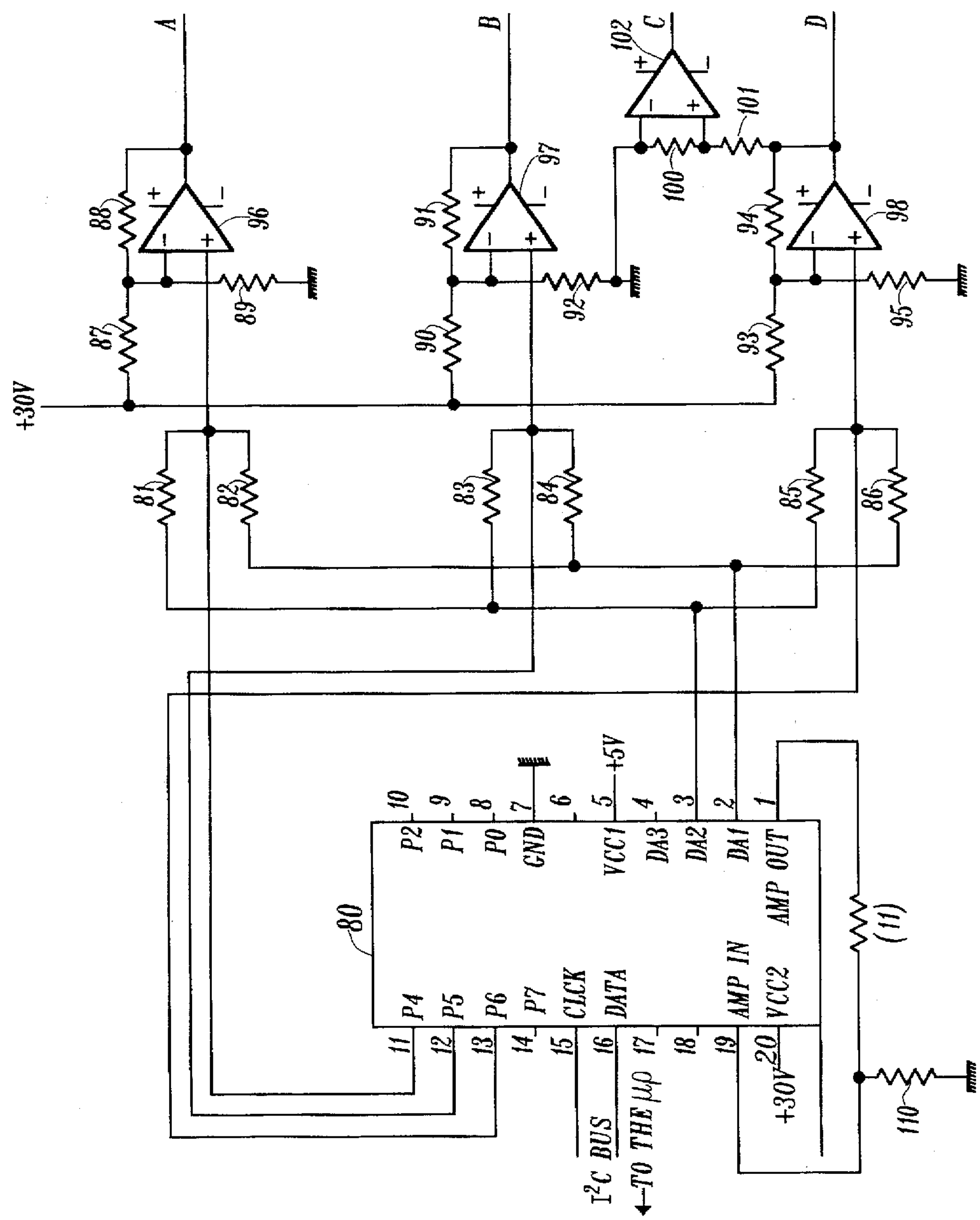
FIG. 3 illustrates the arrangement for controlling the varactors and switching diodes in the circuits of FIG. 2.

FIG. 2 represents the RF section of block 10 of FIG. 1. Three double tuned varactor tuned bandpass circuits (a mid band, a low band and a high band) are connected between the RF input and the RF output. A typical frequency distribution for the three bandpass filters is: low band 50–125 MHz; mid band 125–350 MHz; and high band 350–800 MHz. Each double tuned circuit is provided with either a positive variable tuning voltage or a fixed negative switching voltage. These voltages appear on control lines A, B and D. A control line C also carries a voltage for connecting or disconnecting (by means of switching diodes 62, 65, 68 and 71) the high band filter circuit. The appropriate voltage levels on control lines A, B, C, D are provided by a controller section which in turn is controlled by microprocessor 12 via an $I^2C$ bus as shown in FIG. 3.

The operation of the low and mid band circuits, with the high band circuit deactivated, will be discussed first. The high band is deactivated when switching diodes 62 and 68 are reverse biased through resistors 63 and 69 by control line C and switching diodes 65 and 71 are forward biased by the same control line C and resistors 64 and 70. The resulting high impedance of diodes 62 and 68 and the low impedance of diodes 65 and 71 decouples the high band circuit from both the RF input and the RF output terminals. In addition varactors 51 and 55 and varactors 53 and 56 are driven into conduction through resistor 73 by virtue of a negative voltage on control line D. This increases the decoupling effect.

With particular reference to the low band circuit, the tuning varactors 43 and 46 and the coupling varactor 44 are connected to control line B through a resistor 60. A small series capacitor 45 and a shunt capacitor 47 together with the varactors form the capacitive portion of the low band bandpass circuit while coils 42 and 48 and coils 32 and 41 form the inductive portion.

A substantially similar arrangement exists for the mid band circuit where tuning varactors 34 and 38 and coupling varactor 37 are connected to control line A by a resistor 30. A small series capacitor 36 and shunt capacitors 35 and 39, together with the varactors form the capacitive portion of the mid band bandpass circuit while the coils 33, 32 and 42 and 40, 41 and 48 form the inductive portion. It should be noted that when the varactors are not used as tuning or coupling elements (in a first mode), they are used as switching diodes (in a second mode) to effectively shunt the high impedance points of the inactive bandpass filters to ground. Further, two coils of the inactive mid band bandpass form part of the active low band bandpass and vice versa.

When the high band is activated, switching diodes 62 and 68 are forward biased via resistors 63 and 69, respectively, which are coupled to the now positive control line C. The high band filter is in this way connected through capacitors 61 and 67 to the RF input and RF output, respectively. Switching diodes 65 and 71, which are coupled to control line C through resistors 64 and 70, respectively, are reverse biased and thus do not substantially affect the circuit. Varactors 51 and 55 are used as tuning varactors and varactors 53 and 56 are used as coupling varactors for the high band. In addition capacitors 54, 52 and 57 together with varactors 51 and 55 and varactors 53 and 56 form the capacitive portion of the high band bandpass circuit while coils 50, 49, 42 and 32 and coils 58, 59, 48 and 41 form the inductive portion. Note that coils 42 and 32 from the inactive low and mid band circuits are in parallel and are connected between the RF input and ground and that coils 41 and 48 are also in parallel and connected between the RF output and ground.

FIG. 3 illustrates a representative controller section of block 10. The controller section generates the necessary tuning (variable positive) and switching (fixed negative) voltage levels on control lines A, B and D and either a fixed positive voltage, for high band activation, or a fixed negative voltage, for low and mid band activation, on control line C. In this embodiment, an integrated circuit 80 (MOTOROLA Part No. MC 44810) provides bandswitching numbered at terminals 11, 12 and 13 which correspond to functional terminals P4, P5, P6. For simplicity, the functional designations will be considered terminal designations hereinafter. Integrated circuit 80 also supplies D/A conversion (coarse tuning at terminal DA1 and fine tuning at terminal DA2) in response to a control signal provided by microprocessor 12 over the $I^2C$ bus. The coarse and fine tuning voltage levels from DA1 and DA2 are added by means of one of the resistor pairs 81–82, 83–84 and 85–86 depending on which band has been selected. The band selection is accomplished by selecting the corresponding one of pins P4, P5, P6 to be open (open collector output pins) and grounding the remaining two pins. In response to the latter action, the one of the three op-amps 96, 97 and 98 that corresponds to the selected band generates a positive tuning voltage in its output while the remaining two op-amps provide a fixed negative output voltage level to deactivate the remaining two bands. Resistors 87 through 95 are selected such that control lines A, B and D provide the necessary tuning voltages for their corresponding bandpass filters. Op-amp 102 is used as a comparator for sensing the polarity on line D which is associated with the high band filter. When control line D is positive (tuning or first mode), then op-amp 102 provides a fixed positive voltage on control line C causing switching diodes 62 and 68 to be conductive and diodes 65 and 71 to be in a high impedance state, thus effectively connecting the high band filter between the RF input and the RF output. Conversely, when control line D is negative, op-amp 102 places a negative voltage on control line C causing the switching diodes 62 and 68 to be in a high impedance state and diodes 65 and 71 to be conductive, thus effectively preventing the high band filter from carrying any signals or exerting any influence on the low band or mid band bandpass filters. Resistors 110, 111 are used to set up a reference voltage for the two A/D converters of IC 80.

The formula for changing the capacitive coupling factor is that the product of the coupling factor and the loaded Q of the active bandpass filter circuit should be close to unity across the particular tuning range. This is facilitated by the proper selection of values for fixed capacitors 45 and 47 for the low band, capacitors 36, 35 and 39 for the mid band and capacitors 54, 52 and 57 for the high band; provided, however, that the varactors in each bandpass are the same (matched). Thus over the active tuning range of the low band bandpass filter, the voltage on control line B applied to tuning varactors 43 and 46 will be identical with the voltage across coupling varactor 44 to maintain the product of the coupling factor and the loaded Q of the circuit close to unity over the tuning range of the bandpass filter. At the same time, elements of the other bandpass circuits may be operated in a variety of ways. In the preferred form of the invention, the tuning varactors and the coupling varactors of the non active (or non selected filter circuits) are operated in the second (switched) mode and exhibit low impedances. This operation effectively places the inductors 32 and 41 of the mid band bandpass circuit in parallel with the RF input and RF output terminals.

Beyond the tuning range of the low band bandpass filter the mid band filter is activated and the low band bandpass filter varactors are operated in the second (switched) mode. When the voltage on control line B applied to tuning varactors 43, 46 and coupling varactor 44 is negatively biased, the varactors are driven into forward conduction and become essentially short circuits. Therefore, inductor 42 is effectively placed across the RF input terminal and inductor 48 is effectively placed across the RF output terminal. Simultaneously, varactors 34 and 38 and coupling varactor 37 are operated in the first mode for continuing the tuning of the RF input signals while simultaneously changing the coupling factor of the mid band bandpass filter to maintain (together with capacitors 35, 36 and 39) the above described relationship between the coupling factor and circuit loaded Q. When RF signals in the high band are tuned, appropriate signals are applied to switching diodes 62 and 68 to render them conductive and to switching diodes 65 and 71 to put them in a high impedance mode to enable the high band bandpass circuit. Thus tuning varactors 51 and 55 and coupling varactors 53 and 56 are placed in the first mode and operate substantially as described above for high band signals. Also, all varactors in the low band and the mid band bandpass filters are operated in the second mode to render both the low and mid band bandpasses inoperative.

The use of three bandpass filter circuits to cover the tuning range is preferred but the invention is not to be limited to any particular number. It should also be recognized that when in the different modes, the circuits are effective for substantially (i.e. primarily) tuning or for primarily bypassing. Also, while the tuning varactors primarily tune and the coupling varactors primarily couple, they each do a little of the other. This is well understood in the art. It is recognized that numerous changes in the described embodiment of the invention will be apparent to those skilled in the art without departing from its true spirit and scope. The invention is to be limited only as defined in the claims.

What is claimed is:

1. A selective RF circuit comprising:

a plurality of double tuned bandpass filters each including a controllable tuning varactor which in a first mode exhibits a variable capacitance for tuning its associated bandpass filter and which in a second mode is biased into conduction to disable its associated bandpass filter.

2. The circuit of claim 1 further including a coupling varactor coupled to each said bandpass filter, said coupling varactor when in said first mode varying its coupling factor and when in said second mode being biased into conduction.

3. The circuit of claim 2 wherein said tuning varactor and said coupling varactor are operated in said first mode for tuning the associated bandpass filter over a frequency range while changing the coupling factor to maintain the product of the loaded Q of the bandpass filter and the coupling factor close to unity.

4. The circuit of claim 3 further including:

digital-to-analog converter means coupled to said tuning varactor and said coupling varactor; and microprocessor means for supplying control signals to said digital-to-analog converter means.

5. The circuit of claim 4 further including polarity reversal means coupled to said microprocessor means for operating said tuning varactor and said coupling varactor in said second mode.

6. A selective RF circuit comprising:

a plurality of double-tuned bandpass filters each including two controllable tuning varactors which in a first mode exhibit a variable capacitance for primarily tuning their associated bandpass filter and which in a second mode are biased into conduction;

at least one coupling varactor coupling the primary and second side of each said bandpass filter, said coupling varactor when in said first mode primarily varying the bandpass coupling factor and when in said second mode being biased into conduction and cooperating with said tuning varactors to disable their associated bandpass filter.

7. The circuit of claim 6 wherein said bandpass filters include fixed series and shunt capacitors, and wherein said tuning varactors and said coupling varactor, in conjunction with said fixed series and shunt capacitors, are operated in said first mode for tuning their associated bandpass filter over a frequency range while changing said coupling factor to maintain the product of the loaded Q of said bandpass filter and said coupling factor close to unity.

8. The circuit of claim 7 further including:

digital-to-analog converter means coupled to said two tuning varactors and said coupling varactor; and microprocessor means for supplying control signals to said digital-to-analog converter means.

9. The circuit of claim 8 further including polarity reversal means coupled to said microprocessor means for operating said two tuning varactors and said coupling varactor in said second mode.

10. A selective RF circuit for a double conversion tuner including low band, mid band and high band double-tuned bandpass filters comprising:

two tuning varactors in each of said bandpass filters;

at least one coupling varactor in each of said bandpass filters;

an RF input terminal and an RF output terminal;

an inductor coupled between each of said RF input terminal and RF output terminals, on the one hand, and said tuning varactors, on the other hand;

means for controlling said tuning varactors and said coupling varactor whereby in a first mode said varactors primarily exhibit a variable tuning capacitance and in a second mode said varactors primarily exhibit a low impedance;

a switching diode coupled between said RF input terminal and the input of said inductors and said RF output terminal and the output of said high band bandpass filter; and means for supplying respective control voltages to said switching diodes and to said tuning and coupling varactors for selectively enabling said bandpass filters for tuning across the frequency band while maintaining the product of the loaded Q and the coupling factor of the active one of said bandpass filters close to unity.

11. The circuit of claim 10 wherein said inductors in said low band and said mid band bandpass filters are coupled in parallel with said inductors in said high band when said high band is active.

12. A method of operating a selective RF circuit having a plurality of double tuned bandpass filters each including a controllable tuning varactor comprising:

biasing the tuning varactor in a first mode to exhibit a variable capacitance for tuning its associated bandpass filter; and biasing the tuning varactor in a second mode into conduction to disable its associated bandpass filter.

13. The method of claim 12 wherein a coupling varactor is associated with each tuning varactor in each respective bandpass filter and further comprising:

varying the coupling factor of the coupling varactor in the first mode; and biasing the coupling varactor into conduction in the second mode.

14. The method of claim 13 wherein fixed shunt and series capacitors are associated with the bandpass filters and further comprising:

operating the tuning varactors and the coupling varactors in the first mode for cooperating with the series and shunt fixed capacitors for tuning their respective associated bandpass filters over a frequency range while changing the coupling factor to maintain the product of the loaded Q of their associated bandpass filter and the coupling factor close to unity.

15. A method of operating a selective RF circuit having a plurality of double tuned bandpass filters each including a pair of controllable tuning varactors and at least one coupling varactor comprising:

in a first mode, biasing the tuning varactors to exhibit a variable capacitance and varying the coupling factor of the coupling varactor for tuning their associated bandpass filter; and in a second mode, biasing the tuning varactors and the coupling varactor into conduction to disable their associated bandpass filter.

16. The method of claim 11 wherein fixed shunt and series capacitors are associated with the bandpass filters and further comprising:

operating the tuning varactors and the coupling varactors in the first mode for cooperating with the shunt and series capacitors for tuning their associated bandpass filters over a frequency range while changing the coupling factor to maintain the product of the loaded Q of their associated bandpass filter and the coupling factor close to unity.

* * * * *